United States Patent
Zitouni et al.

(10) Patent No.: US 9,362,394 B2
(45) Date of Patent: Jun. 7, 2016

(54) POWER DEVICE TERMINATION STRUCTURES AND METHODS

(71) Applicants: Moaniss Zitouni, Gilbert, AZ (US); Edouard D. de Frésart, Tempe, AZ (US); Pon Sung Ku, Gilbert, AZ (US); Ganming Qin, Chandler, AZ (US)

(72) Inventors: Moaniss Zitouni, Gilbert, AZ (US); Edouard D. de Frésart, Tempe, AZ (US); Pon Sung Ku, Gilbert, AZ (US); Ganming Qin, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/307,678

(22) Filed: Jun. 18, 2014

(65) Prior Publication Data

US 2015/0372130 A1    Dec. 24, 2015

(51) Int. Cl.
| | |
|---|---|
| *H01L 29/78* | (2006.01) |
| *G06F 17/50* | (2006.01) |
| *H01L 29/66* | (2006.01) |
| *H01L 29/06* | (2006.01) |
| *H01L 29/40* | (2006.01) |
| *H01L 29/08* | (2006.01) |
| *H01L 29/10* | (2006.01) |
| *H01L 29/423* | (2006.01) |

(52) U.S. Cl.
CPC ........ *H01L 29/7813* (2013.01); *G06F 17/5009* (2013.01); *G06F 17/5072* (2013.01); *H01L 29/063* (2013.01); *H01L 29/0696* (2013.01); *H01L 29/0852* (2013.01); *H01L 29/1095* (2013.01); *H01L 29/407* (2013.01); *H01L 29/4236* (2013.01); *H01L 29/66734* (2013.01); *H01L 29/7811* (2013.01)

(58) Field of Classification Search
CPC ....................................................... H01L 29/66
See application file for complete search history.

(56) References Cited

U.S. PATENT DOCUMENTS

| | | | |
|---|---|---|---|
| 7,855,415 B2 | 12/2010 | Challa et al. | |
| 8,431,989 B2 | 4/2013 | Bhalla et al. | |
| 2005/0145936 A1* | 7/2005 | Polzl | H01L 29/402 257/341 |
| 2008/0227269 A1 | 9/2008 | Ma | |
| 2009/0189181 A1* | 7/2009 | Koyama | H01L 29/0696 257/139 |

* cited by examiner

*Primary Examiner* — Fernando L Toledo
*Assistant Examiner* — Valerie N Newton

(57) ABSTRACT

Power device termination structures and methods are disclosed herein. The structures include a trenched-gate semiconductor device. The trenched-gate semiconductor device includes a semiconducting material and an array of trenched-gate power transistors. The array defines an inner region including a plurality of inner transistors and an outer region including a plurality of outer transistors. The inner transistors include a plurality of inner trenches that has an average inner region spacing. The outer transistors include a plurality of outer trenches that has an average termination region spacing. The average termination region spacing is greater than the average inner region spacing or is selected such that a breakdown voltage of the plurality of outer transistors is greater than a breakdown voltage of the plurality of inner transistors.

20 Claims, 3 Drawing Sheets

POWER DEVICE TERMINATION STRUCTURES AND METHODS

FIELD

This disclosure relates generally to power device termination structures and methods, and more specifically to power device termination structures and methods for trenched-gate power transistors.

BACKGROUND

A power device, such as a trenched-gate semiconductor device, can include a plurality of trenched-gate power transistors. These transistors can be arranged in a one- or two-dimensional array. In such a configuration, an electronic environment of, or an electric field that is experienced by, trenched-gate semiconductor devices can differ with location within the array. For example, the electronic environment of trenched-gate semiconductor devices that are on, or near, a periphery of the array can differ from an electronic environment of trenched-gate semiconductor devices that are within an interior of the array. This difference in the electronic environment can produce differences in operational characteristics of the devices within the periphery when compared to the devices within the interior.

As an illustrative, non-exclusive example, the difference in the electronic environment can cause a breakdown voltage of the devices within the termination region to be different from (or less than) a breakdown voltage of the devices within the inner region. Thus, it is known to provide one or more termination structures within a termination region that includes, or is proximal to, the outer devices. However, formation of these termination structures generally requires additional processing or masking steps, which can increase an overall production cost of the power device. In addition, certain termination structures may not be compatible with certain trenched-gate power transistors.

BRIEF DESCRIPTION OF THE DRAWINGS

The present invention is illustrated by way of example and is not limited by the accompanying Figures, in which like reference numerals indicate similar elements. Elements in the Figures are illustrated for simplicity and clarity and have not necessarily been drawn to scale.

DETAILED DESCRIPTION

A trenched-gate semiconductor device according to the present disclosure includes an array of trenched-gate power transistors that is formed on, or within, a semiconducting material. The array includes an inner region and an outer region. The inner region includes a plurality of inner transistors. Similarly, the outer region includes a plurality of outer transistors. The trenched-gate power transistors include trenches, which are formed within the semiconducting material. The trenches include a plurality of inner trenches, which has an average inner region spacing, and a plurality of outer trenches, which has an average termination region spacing. In the structures and methods according to the present disclosure, the average termination region spacing can be defined, patterned, designed, or selected to be greater than the average inner region spacing. This greater termination region spacing causes the plurality of outer transistors to have a greater breakdown voltage than the plurality of inner transistors, thereby permitting termination of the array of trenched-gate power transistors without the need for the additional processing steps or space that generally is required for more traditional termination structures.

Figure 1:
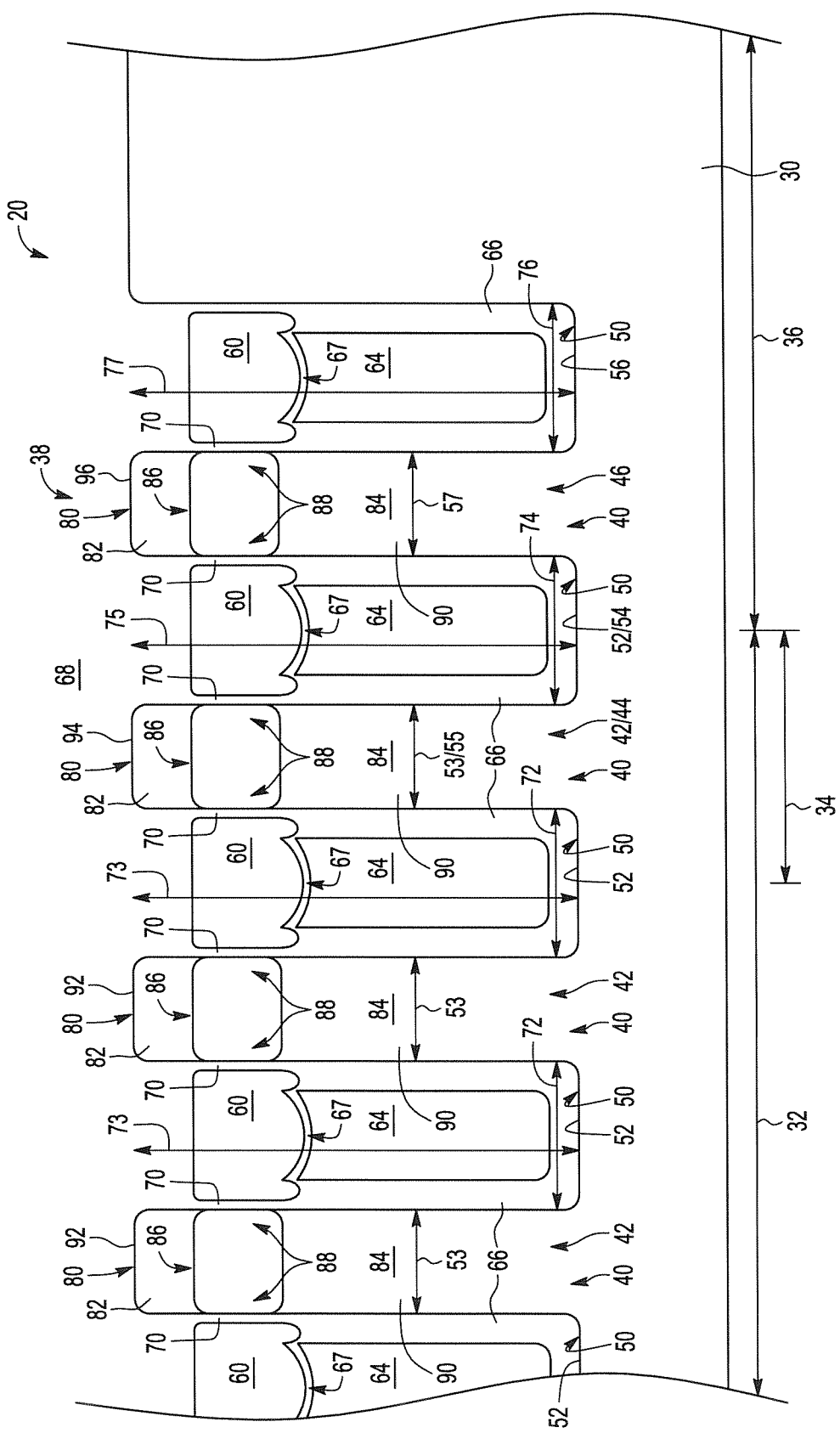
FIG. 1 is a schematic cross-sectional view of an illustrative, non-exclusive example of a portion of a trenched-gate semiconductor device according to the present disclosure.

FIG. 1 is a schematic cross-sectional view of an illustrative, non-exclusive example of a portion of a trenched-gate semiconductor device 20 according to the present disclosure that includes an array 38 of trenched-gate power transistors 40. Trenched-gate power transistors 40 include an electrically conductive gate 60 that extends at least partially within a trench 50 that is defined within a semiconducting material 30. Trenched-gate power transistors 40 further include a gate oxide 70, which is located between, extends vertically between, or electrically separates electrically conductive gate 60 and semiconducting material 30. It is within the scope of embodiments of the present invention that trenched-gate semiconductor device 20 can include one or more additional structures that can be outside, or that can surround, array 38.

Array 38 includes an inner region 32, which includes a plurality of inner transistors 42, and an outer region 36, which includes a plurality of outer transistors 46. Outer region 36 also may be referred to herein as a termination region 36. Inner transistors 42 include a plurality of inner trenches 52 that has an average inner region spacing 53. Outer transistors 46 include a plurality of outer trenches 56 that has an average termination region spacing 57. As discussed in more detail herein, the plurality of outer transistors 46 can surround, or form a perimeter around, the plurality of inner transistors 42.

Average inner region spacing 53 is defined between each of the plurality of inner trenches 52 and a closest other of the plurality of inner trenches 52. Additionally or alternatively, average inner region spacing 53 also can be defined as an average, or mean, spacing, or distance, between adjacent inner trenches 52 or as an average width of columns 80 that separate adjacent inner trenches 52. Average termination region spacing 57 is defined between each of the plurality of outer trenches and a closest one of the plurality of inner trenches. Additionally or alternatively, average termination region spacing 57 can be defined as an average, or mean, spacing, or distance, between each outer trench 56 and the closest one of the plurality of inner trenches 52 or as an average width of columns 80 that separate inner trenches 52 from outer trenches 56. As discussed in more detail herein, average termination region spacing 57 is greater than average inner region spacing 53 and also may be referred to herein as an average outer region spacing 57.

As illustrated in FIG. 1, array 38 or inner region 32 thereof also can include an intermediate region 34 that includes a plurality of intermediate transistors 44. Each intermediate transistor 44 can extend between a respective one of the plurality of outer transistors 46 and a respective one of the plurality of inner transistors 42. Intermediate transistors 44 include a plurality of intermediate trenches 54 that have, or define, an average intermediate region spacing 55.

Average intermediate region spacing 55 is defined between each of the plurality of intermediate trenches 54 and a closest (or nearest) other of the plurality of inner trenches 52. Additionally or alternatively, average intermediate region spacing 55 can be defined as an average, or mean, spacing, or distance between each intermediate trench 54 and the closest other of the plurality of inner trenches 52 or as an average width of columns 80 that separate intermediate trenches 54 from the closest other of the plurality of inner trenches 52.

When array 38 includes intermediate region 34, average termination region spacing 57 is defined between each of the plurality of intermediate trenches 54 and a closest one of the plurality of outer trenches 56. Average intermediate region spacing 55 can be greater than average inner region spacing 53 but less than average termination region spacing 57. FIG. 1 illustrates a single intermediate trench 54 having average intermediate region spacing 55. However, it is within the scope of embodiments of the present invention that array 38 can include a plurality of intermediate trenches 54 that have the same average intermediate region spacing 55 or that define a graded, staggered, or graduated average intermediate region spacing that is greater than average inner region spacing 53 but less than average termination region spacing 57.

It is within the scope of embodiments of the present invention that trenches 50, including inner trenches 52, intermediate trenches 54, and outer trenches 56 can have similar, or even the same, nominal dimensions. As an illustrative, non-exclusive example, an average inner trench width 72 can be nominally equal to an average intermediate trench width 74 or to an average outer trench width 76. As another illustrative, non-exclusive example, an average inner trench depth 73 can be nominally equal to an average intermediate trench depth 75 or to an average outer trench depth 77. It is also within the scope of embodiments of the present invention that all inner trenches 52 can have, or define, nominally the same, or a constant, spacing (i.e., average inner region spacing 53).

Similarly, inner transistors 42 can be designed to be nominally, or functionally, equivalent to intermediate transistors 44 or to outer transistors 46. However, and as discussed in more detail herein, trenches 50 are spaced such that a breakdown voltage of inner transistors 42 is less than a breakdown voltage of intermediate transistors 44 or a breakdown voltage of outer transistors 46. In addition, trenches 50 can be spaced such that the breakdown voltage of intermediate transistors 44 is less than the breakdown voltage of outer transistors 46.

As used herein, the term "nominal" or "nominally," when utilized in conjunction with dimensions of trenches 50, indicates designed, or desired, dimensions of trenches 50. Thus, and while it is understood that the dimensions of trenches 50 are permitted to vary, at least to some extent, due to processing variations, the trenches can be designed to have the same (i.e., nominally the same) dimensions. As illustrative, non-exclusive examples, inner trenches 52, intermediate trenches 54, or outer trenches 56 can be designed, or patterned, to have the same trench width and the same trench depth.

As illustrated in FIG. 1, semiconducting material 30 defines a plurality of columns 80. Columns 80 also may be referred to herein as projections 80 or as extensions 80 and extend between, or define, adjacent trenches 50. Columns 80 include inner columns 92, which are within inner region 32 or which define average inner region spacing 53, and outer columns 96, which are within termination region 36 or which define average termination region spacing 57. Columns 80 also may include intermediate columns 94, which can be within intermediate region 34 or which define average intermediate region spacing 55.

Columns 80 include, or define, a source region 82 of a first conductivity type, a drain drift region 84 of the first conductivity type, and a body region 86 of a second conductivity type. Body region 86 extends between or electrically separates source region 82 and drain drift region 84. In addition, body region 86 extends in contact with gate oxide 70 or forms, or defines, a channel region 88 of trenched-gate power transistors 40. Columns 80 further can include a reduced surface field (RESURF) region 90. RESURF region 90 can be located within drain drift region 84 or can be configured to form a depletion region within drain drift region 84.

The first conductivity type may be n-type (i.e., may utilize electrons as the majority charge carrier) or p-type (i.e., may utilize holes as the majority charge carrier). The second conductivity type is the opposite of the first conductivity type. Thus, when the first conductivity type is n-type, the second conductivity type is p-type. Conversely, when the first conductivity type is p-type, the second conductivity type is n-type.

As illustrated in FIG. 1, trenches 50 further can include electrically conductive field plates 64. Electrically conductive field plates 64 can be located below respective electrically conductive gates 60 within respective trenches 50. In addition, electrically conductive field plates 64 can be electrically isolated from electrically conductive gates 60, such as via a thin isolating oxide 67, and from semiconducting material 30, such as via a thick isolating oxide 66. Electrically conductive field plates 64 can be electrically connected to a ground plane of trenched-gate semiconductor device 20 or can be configured to electrically shield electrically conductive gates 60. As further schematically illustrated in FIG. 1, an electrically insulating material 68 can at least partially coat, cover, or encapsulate array 38.

It is within the scope of embodiments of the present invention that array 38 may include, or be, any suitable array of trenched-gate power transistors 40. As an illustrative, non-exclusive example, and as illustrated in FIG. 1, array 38 may be a one-dimensional array. Under these conditions, array 38 may include two outer trenches 56, one at each end of the one-dimensional array. As another illustrative, non-exclusive example, FIG. 1 may represent a cross-sectional view of a two-dimensional array. When array 38 is a two-dimensional array, the plurality of inner transistors 42 can be (partially or completely) surrounded by the plurality of outer transistors 46, such as when the plurality of outer transistors 46 extends around an outer perimeter of the plurality of inner transistors 42.

Semiconducting material 30 can include or be any suitable semiconducting material. As illustrative, non-exclusive examples, semiconducting material 30 can include silicon, silicon germanium, gallium arsenic, gallium arsenide, a Group IV semiconducting material, or a Group III-V semiconducting material. It is within the scope of embodiments of the present invention that semiconducting material 30 can be a bulk semiconducting material that forms a portion of a substrate; however, it is also within the scope of embodiments of the present invention that semiconducting material 30 can be an epitaxial layer that is grown on the substrate.

Figure 2:
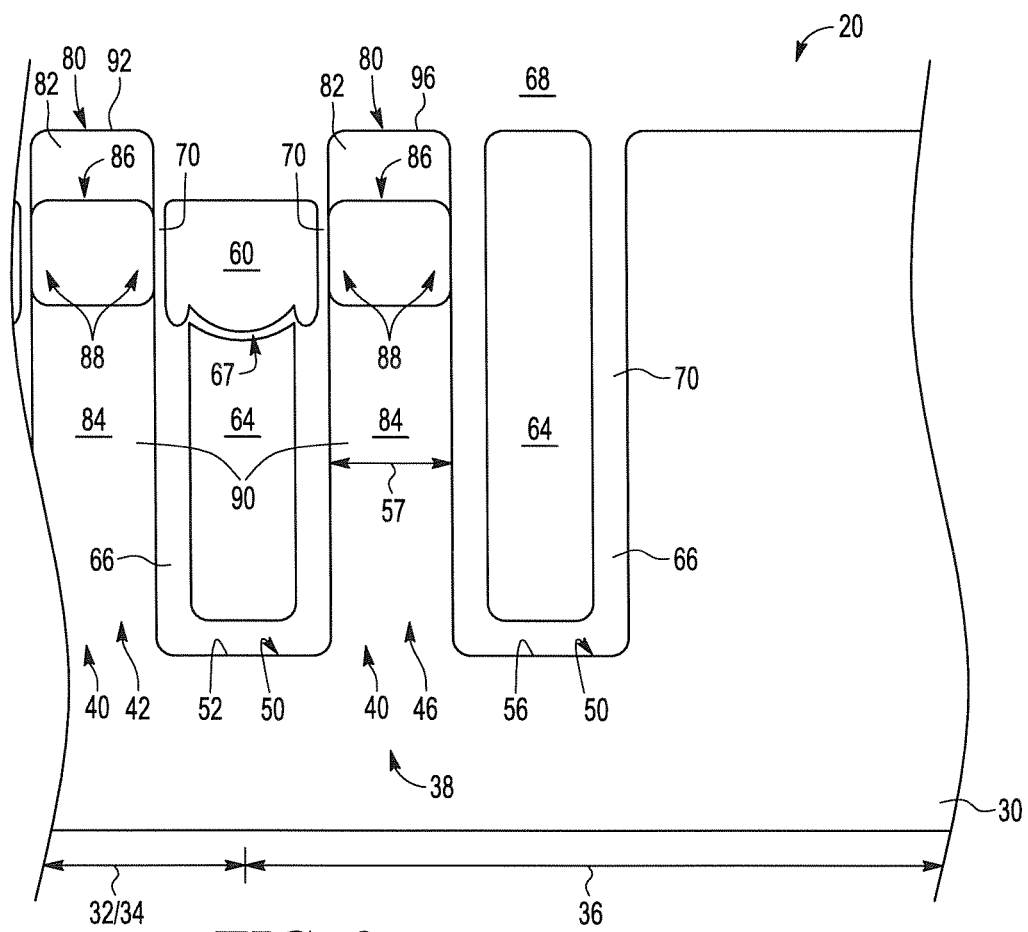
FIG. 2 is a schematic cross-sectional view of another illustrative, non-exclusive example of a portion of a trenched-gate semiconductor device according to the present disclosure.

Gate oxide 70 can include, or be, any suitable electrically insulating oxide layer that is located or present between electrically conductive gate 60 and semiconducting material 30. Similarly, thick isolating oxide 66 or thin isolating oxide 67 can include, or be, any suitable electrically insulating oxide layer that is located, or present, between electrically conductive gate 60 and electrically conductive field plate 64, or between electrically conductive field plate 64 and semiconducting material 30. In addition, electrically insulating material 68 can include, or be, any suitable electrically insulating material that at least partially covers, or encapsulates, array 38. As illustrative, non-exclusive examples, gate oxide 70, thick isolating oxide 66, thin isolating oxide 67, or electrically isolating material 68 can include a thermally grown oxide, such as a thermally grown silicon oxide, a deposited oxide, such as deposited silicon oxide, or another dielectric material. Gate oxide 70, thin isolating oxide 67, thick isolating oxide 66, and electrically isolating material 68 are all electrically insulating materials, and FIGS. 1-2 schematically illustrate these electrically insulating materials without breaks or interfaces therebetween. However, it is to be understood that gate oxide 70, thin isolating oxide 67, thick isolating oxide 66, and electrically isolating material 68 can be formed from different materials, can be formed at different times during fabrication of trenched-gate semiconductor device 20, or may define interfacial regions therebetween.

Electrically conductive gate 60 and electrically conductive field plate 64 can include, or be formed from, any suitable electrically conductive material that is located, placed, or deposited at least partially, or completely, within trenches 50. As illustrative, non-exclusive examples, electrically conductive gate 60 or electrically conductive field plate 64 can include, or be formed from, a doped semiconducting material or doped polysilicon. When electrically conductive gate 60 and electrically conductive field plate 64 are formed from doped polysilicon, electrically conductive field plate 64 also may be referred to herein as a poly 1 layer 64 and electrically conductive gate 60 also may be referred to herein as a poly 2 layer 60.

Source region 82, drain drift region 84, body region 86, or RESURF region 90 can be located, or formed, within array 38 or within columns 80 thereof in any suitable manner. As an illustrative, non-exclusive example, source region 82, drain drift region 84, body region 86, or RESURF region 90 can include, or be, doped regions of columns 80 that are formed via an implant process or via a diffusion process.

FIG. 2 is a schematic cross-sectional view of another illustrative, non-exclusive example of a trenched-gate semiconductor device 20 according to the present disclosure. Trenched-gate semiconductor device 20 of FIG. 2 is similar to trenched-gate semiconductor device 20 of FIG. 1 and can include any structure that is disclosed or discussed herein with reference to FIG. 1. However, in FIG. 2, outer trenches 56 do not include electrically conductive gate 60. Instead, and as illustrated, electrically conductive field plate 64 (or poly 1 layer 64) of outer trenches 56 extends within a larger fraction of a depth of outer trenches 56 and also may be referred to herein as a shield poly.

In addition, gate oxide 70 within outer trenches 56 is thicker than gate oxide 70 of inner trenches 52. This can further increase the breakdown voltage of outer transistors 46 relative to inner transistors 42. As illustrative, non-exclusive examples, gate oxide 70 within outer trenches 56 can be at least 2, at least 2.5, at least 3, at least 3.5, at least 4, at least 4.5, or at least 5 times thicker than gate oxide 70 of inner trenches 52. Additionally or alternatively, gate oxide 70 within outer trenches 56 can have a similar thickness to (or can be) thick isolating oxide 66 of inner trenches 52.

Figure 3:
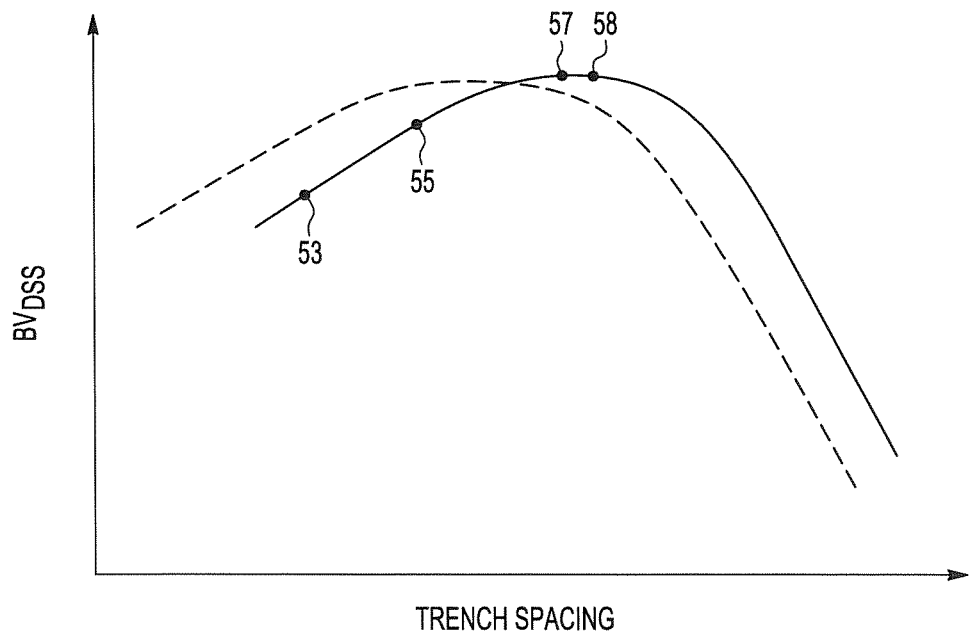
FIG. 3 is a schematic representation of a breakdown voltage vs. trench spacing curve for an array of trenched-gate power transistors according to the present disclosure.

FIG. 3 is a schematic representation of a breakdown voltage vs. trench spacing curve for an array of trenched-gate power transistors according to the present disclosure (such as array 38 of FIGS. 1-2). FIG. 3 plots the source-to-drain breakdown voltage (i.e., $BV_{DSS}$) for a trenched-gate power transistor (such as trenched-gate power transistors 40 of FIGS. 1-2) as a function of spacing (such as average inner region spacing 53, average intermediate region spacing 55, or average termination region spacing 57 of FIGS. 1-2) between adjacent trenches (such as trenches 50 of FIGS. 1-2). For each of the curves that is illustrated in FIG. 3, other system parameters, such as trench dimensions, oxide thickness, or doping levels, are held constant.

As illustrated in FIG. 3, source-to-drain breakdown voltage increases (or monotonically increases) with spacing between adjacent trenches over a range of spacing values before reaching a maximum 58 source-to-drain breakdown voltage value. Then, the source-to-drain breakdown voltage decreases (or monotonically decreases) with further increases in the spacing between adjacent trenches. This systematic variation in source-to-drain breakdown voltage as a function of spacing between adjacent trenches can permit formation of arrays of trenched-gate power transistors that exhibit a greater source-to-drain breakdown voltage within a termination region thereof (such as termination region 36 of FIGS. 1-2) when compared to a source-to-drain breakdown voltage within an inner region thereof (such as inner region 32 of FIGS. 1-2).

As an illustrative, non-exclusive example, the average spacing between trenches within the inner region (i.e., the average inner region spacing) is indicated at 53 in FIG. 3, while the average spacing between trenches within the termination region (i.e., the average termination region spacing) is indicated at 57 in FIG. 3, and the source-to-drain breakdown voltage at average spacing 57 between trenches within the termination region is greater than the source-to-drain breakdown voltage at average spacing 53 between trenches within the inner region. As another illustrative, non-exclusive example, the average spacing between trenches within an intermediate region (i.e., average intermediate region spacing 55 within intermediate region 34 of FIGS. 1-2) can be indicated at 55 in FIG. 3, and the source-to-drain breakdown voltage associated with this trench spacing can be greater than the source-to-drain breakdown voltage that is associated with average spacing 53 and less than the source-to-drain breakdown voltage that is associated with average spacing 57. Thus, selection of the relative spacing between trenches in various regions of the array of trenched-gate power transistors permits selective control of the breakdown voltage of trenches that are located within these various regions, which permits design and construction of trenched-gate semiconductor devices 20 that exhibit a desired degree, or level, of protection against transistor breakdown within termination region 36.

As discussed, for arrays 38 according to the present disclosure, average termination region spacing 57 is greater than average inner region spacing 53. In addition, average termination region spacing 57 can be selected to be at, or near, maximum 58 source-to-drain breakdown voltage or can be selected to be within the increasing portion of the source-to-drain breakdown voltage vs. trench spacing curve. This causes the source-to-drain breakdown voltage within the termination region to be greater than the source-to-drain breakdown voltage within the inner region. As illustrative, non-exclusive examples, average termination region spacing 57 can be at least 101%, at least 102%, at least 103%, at least 104%, at least 105%, at least 106%, at least 107%, at least 108%, at least 109%, or at least 110% of average inner region spacing 53. As additional illustrative, non-exclusive examples, average termination region spacing 57 can be less than 130%, less than 128%, less than 126%, less than 124%, less than 122%, less than 120%, less than 119%, less than 118%, less than 117%, less than 116%, less than 115%, less than 114%, less than 113%, less than 112%, less than 111%, less than 110%, less than 109%, less than 108%, less than 107%, less than 106%, or less than 105% of average inner region spacing 53.

As also discussed, when an array 38 according to the present disclosure includes an intermediate region 34, average intermediate region spacing 55 is greater than average inner region spacing 53 but less than average termination region spacing 57. This causes the source-to-drain breakdown voltage within the termination region to be greater than the source-to-drain breakdown voltage within the inner region and greater than the source-to-drain breakdown voltage within the intermediate region. In addition, this also causes the source-to-drain breakdown voltage within the intermediate region to be greater than the source-to-drain breakdown voltage within the inner region but less than the source-to-drain breakdown voltage within the termination region. As illustrative, non-exclusive examples, average intermediate region spacing 55 can be at least 101%, at least 102%, at least 103%, at least 104%, at least 105%, at least 106%, at least 107%, at least 108%, at least 109%, or at least 110% of average inner region spacing 53. As additional illustrative, non-exclusive examples, average intermediate region spacing 55 can be less than 115%, less than 114%, less than 113%, less than 112%, less than 111%, less than 110%, less than 109%, less than 108%, less than 107%, less than 106%, or less than 105% of average inner region spacing 53.

In a more specific but still illustrative, non-exclusive example, average inner region spacing 53 is approximately 0.9 micrometers and average termination region spacing 57 is approximately 1.05 micrometers. Average intermediate region spacing 55 is approximately, 0.93-1.02 micrometers.

A relationship between average inner region spacing 53 and average termination region spacing 57 or among average inner region spacing 53, average intermediate region spacing 55, and average termination region spacing 57 can be selected based upon one or more system parameters of the trenched-gate semiconductor device. Additionally or alternatively, a magnitude of average inner region spacing 53, average intermediate region spacing 55, or average termination region spacing 57 also can be selected based upon the one or more system parameters of the trenched-gate semiconductor device.

As an illustrative, non-exclusive example, FIG. 3 illustrates two different source-to-drain breakdown voltage vs. trench spacing curves. The two curves are shifted relative to one another due to differences in doping levels within the trenched-gate semiconductor device. The dashed curve represents breakdown voltage vs. trench spacing for a trenched-gate semiconductor device that has a higher doping level within source, drain, or body regions thereof when compared to the trenched-gate semiconductor device that is represented by the solid curve. Other system parameters, such as trench width, trench depth, desired breakdown voltage values, or gate oxide thicknesses can cause other shifts in the breakdown voltage vs. trench spacing curve. However, a general shape of the breakdown voltage vs. trench spacing curve still may permit selection of trench spacings that provide systematic and desired variations in breakdown voltages within different regions of the array of trenched-gate power transistors.

Figure 4:
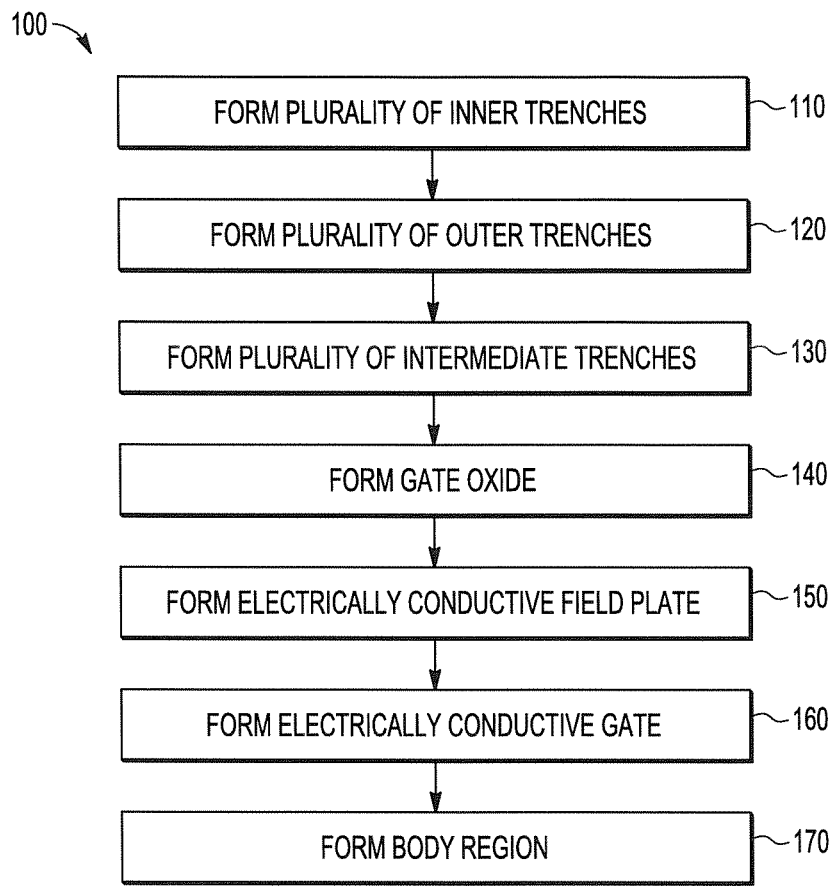
FIG. 4 is a flowchart depicting methods, according to the present disclosure, of forming a trenched-gate semiconductor device.

FIG. 4 is a flowchart depicting methods 100, according to the present disclosure, of forming a trenched-gate semiconductor device. Methods 100 can include forming a plurality of inner trenches within a semiconducting material at 110, forming a plurality of outer trenches within the semiconducting material at 120, or forming a plurality of intermediate trenches within the semiconducting material at 130. Methods 100 further can include forming a gate oxide at 140, forming an electrically conductive field plate at 150, forming an electrically conductive gate at 160, or forming a body region at 170.

Forming the plurality of inner trenches within the semiconducting material at 110 can include forming, or defining, the plurality of inner trenches within, or to define, an inner region of an array of trenched-gate power transistors. The plurality of inner trenches has, or defines, an average inner region spacing therebetween. The average inner region spacing is defined between each of the plurality of inner trenches and a closest other of the plurality of inner trenches, and a spacing between each of the plurality of inner trenches and a closest other of the plurality of inner trenches can be nominally constant or equal to the average inner region spacing.

The forming at 110 can include forming the plurality of inner trenches in any suitable manner or utilizing any suitable process. As illustrative, non-exclusive examples, the forming at 110 can include lithographically patterning the semiconducting material, etching the semiconducting material, dry etching the semiconducting material, wet etching the semiconducting material, or ion milling the semiconducting material.

Forming the plurality of outer trenches within the semiconducting material at 120 can include forming, or defining, the plurality of outer trenches within, or to define, a termination region of the array of trenched-gate power transistors. The plurality of outer trenches has, or defines, an average termination region spacing. The average termination region spacing is defined between each of the plurality of outer trenches and a closest one of the plurality of inner trenches, and the average termination region spacing is greater than the average inner region spacing. Illustrative, non-exclusive examples of the relative magnitudes of the average inner region spacing and the average termination region spacing are disclosed herein.

The forming at 120 can include forming the plurality of outer trenches in any suitable manner or utilizing any suitable process. The forming at 120 can be performed concurrently with, prior to, or subsequent to the forming at 110. As illustrative, non-exclusive examples, the forming at 120 can include lithographically patterning the semiconducting material, etching the semiconducting material, dry etching the semiconducting material, wet etching the semiconducting material, or ion milling the semiconducting material.

The plurality of inner trenches includes a plurality of intermediate trenches that can be present within an intermediate region that extends between the inner region and the termination region. Under these conditions, the forming at 110 further includes forming the plurality of intermediate trenches at 130. The forming at 130 includes forming, or defining, such that the plurality of intermediate trenches extends between a respective one of the plurality of outer trenches and a respective one of a remainder of the plurality of inner trenches. Similar to the plurality of inner trenches and the plurality of outer trenches, the plurality of intermediate trenches has, or defines, an average intermediate region spacing. The average intermediate region spacing is defined between each of the plurality of intermediate trenches and the respective one of the remainder of the plurality of inner trenches and the average termination region spacing is defined between the plurality of intermediate trenches and the plurality of outer trenches. In addition, the forming at 130 includes forming such that the average intermediate region spacing is greater than the average inner region spacing but less than the average termination region spacing.

The forming at 130 can include forming the plurality of intermediate trenches in any suitable manner or utilizing any suitable process. The forming at 130 can be performed concurrently with, prior to, or subsequent to the forming at 110 or the forming at 120. As illustrative, non-exclusive examples, the forming at 130 can include lithographically patterning the semiconducting material, etching the semiconducting material, dry etching the semiconducting material, wet etching the semiconducting material, or ion milling the semiconducting material.

It is within the scope of embodiments of the present invention that the forming at 110, the forming at 120, or the forming at 130 can include forming such that an average inner trench width of the plurality of inner trenches, an average intermediate trench width of the plurality of intermediate trenches, or an average outer trench width of the plurality of outer trenches are nominally equal to one another. Additionally or alternatively, the forming at 110, the forming at 120, or the forming at 130 also can include forming such that an average inner trench depth of the plurality of inner trenches, an average intermediate trench depth of the plurality of intermediate trenches, or an average outer trench depth of the plurality of outer trenches are nominally equal to one another.

The forming at 110, the forming at 120, or the forming at 130 can include forming, or defining, a plurality of columns of the semiconducting material. The plurality of columns extends between, or defines, at least a portion of adjacent trenches in the array of trenched-gate power transistors. Additionally or alternatively, the plurality of columns contains, defines, or has defined therein at least a portion of the plurality of trenched-gate power transistors, as discussed in more detail herein.

Forming the gate oxide at 140 can include forming any suitable gate oxide at any suitable location. As an illustrative, non-exclusive example, the forming at 140 can include forming, or concurrently forming, the gate oxide within the plurality of inner trenches, within the plurality of intermediate trenches, or within the plurality of outer trenches. The forming at 140 includes forming the gate oxide in any suitable manner. As illustrative, non-exclusive examples, the forming at 140 can include thermally growing the gate oxide or depositing the gate oxide. The forming at 140 can be performed at any suitable time or with any suitable sequence within methods 100. As illustrative, non-exclusive examples, the forming at 140 can be performed subsequent to the forming at 110, subsequent to the forming at 120, subsequent to the forming at 130, prior to the forming at 150, prior to the forming at 160, or prior to the forming at 170.

Forming the electrically conductive field plate at 150 can include forming a respective electrically conductive field plate within each of the plurality of inner trenches, within each of the plurality of intermediate trenches, or within each of the plurality of outer trenches. The forming at 150 includes locating, or depositing, any suitable electrically conductive material within the respective trenches. Illustrative, non-exclusive examples of materials that can be included in the electrically conductive field plate are disclosed herein. It is within the scope of embodiments of the present invention that the forming at 150 includes forming the electrically conductive field plate within the plurality of inner trenches and within the plurality of outer trenches. However, it is also within the scope of embodiments of the present invention that the forming at 150 includes forming the electrically conductive field plate within the plurality of inner trenches but not within the plurality of outer trenches. When methods 100 include the forming at 150, the methods further include forming a thin isolating oxide on the electrically conductive field plate such that the thin isolating oxide extends between, or electrically separates, the electrically conductive field plate and the electrically conductive gate that is formed during the subsequently discussed forming at 160.

The forming at 150 can be performed at any suitable time, or with any suitable sequence, within methods 100. As illustrative, non-exclusive examples, the forming at 150 can be performed subsequent to the forming at 110, subsequent to the forming at 120, subsequent to the forming at 130, subsequent to the forming at 140, prior to the forming at 160, or prior to the forming at 170.

Forming the electrically conductive gate at 160 includes forming a respective electrically conductive gate within each of the plurality of inner trenches, within each of the plurality of intermediate trenches, or within each of the plurality of outer trenches. The forming at 160 includes locating, or depositing, any suitable electrically conductive material within the respective trenches. Additionally or alternatively, the forming at 160 includes locating, or depositing, the electrically conductive material such that the gate oxide electrically separates the electrically conductive gate from the semiconducting material. Illustrative, non-exclusive examples of materials that can be included in the electrically conductive gate are disclosed herein.

The forming at 160 can be performed at any suitable time, or with any suitable sequence, within methods 100. As illustrative, non-exclusive examples, the forming at 160 can be performed subsequent to the forming at 110, subsequent to the forming at 120, subsequent to the forming at 130, subsequent to the forming at 140, subsequent to the forming at 150, prior to the forming at 170, or subsequent to the forming at 170.

Forming the body region at 170 can include forming a plurality of respective body regions within the plurality of columns. As an illustrative, non-exclusive example, each of the plurality of columns includes, or defines, a source region of a first conductivity type and a drain drift region of the first conductivity type, and the forming at 170 includes forming the plurality of respective body regions of a second conductivity type within the plurality of columns. The forming at 170 includes forming such that each respective body region extends between, separates, or defines a respective source region and a respective drain drift region. Additionally or alternatively, the forming at 170 also includes forming such that each respective body region extends in contact with the gate oxide that was formed during the forming at 140 or such that the gate oxide extends between and electrically separates the body region and the electrically conductive gate that was formed during the forming at 160. The plurality of body regions can form, or include, a plurality of channel regions of the plurality of trenched-gate power transistors.

The forming at 170 can be performed at any suitable time, or with any suitable sequence, within methods 100. As illustrative, non-exclusive examples, the forming at 170 can be performed prior to the forming at 110, subsequent to the forming at 110, prior to the forming at 120, subsequent to the forming at 120, prior to the forming at 130, subsequent to the forming at 130, prior to the forming at 140, subsequent to the forming at 140, prior to the forming at 150, subsequent to the forming at 150, prior to the forming at 160, or subsequent to the forming at 160.

Figure 5:
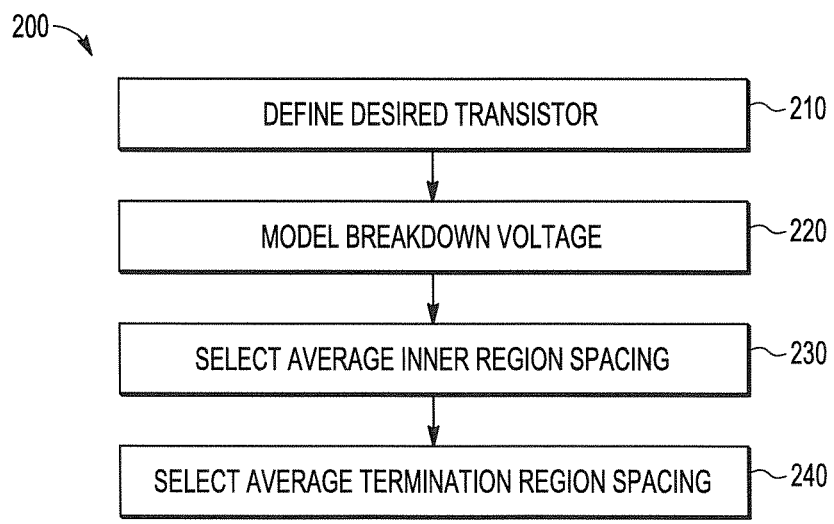
FIG. 5 is a flowchart depicting methods, according to the present disclosure, of designing a trenched-gate semiconductor device.

FIG. 5 is a flowchart depicting methods 200, according to the present disclosure, of designing a trenched-gate semiconductor device. The trenched-gate semiconductor device includes an array of trenched-gate power transistors. Each of the trenched-gate power transistors includes an electrically conductive gate, which extends within a trench that is defined within a semiconducting material, and a gate oxide, which electrically separates the electrically conductive gate from the semiconducting material. The array of trenched-gate power transistors defines an inner region that includes a plurality of inner transistors. The plurality of inner transistors includes a plurality of inner trenches that has an average inner region spacing that is defined between each of the plurality of inner trenches and a closest other of the plurality of inner trenches. The array of trenched-gate power transistors also includes a plurality of outer transistors. The plurality of outer transistors includes a plurality of outer trenches that has an average termination region spacing that is defined between each of the plurality of outer trenches and a closest one of the plurality of inner trenches. Methods 200 can include defining a desired transistor at 210 or modeling a breakdown voltage of the desired transistor at 220. Methods 200 further can include selecting the average inner region spacing at 230 or selecting the average termination region spacing at 240.

Defining the desired transistor at 210 includes defining any suitable property, properties, or structure of a transistor that models, approximates, or represents the trenched-gate power transistors of the trenched-gate semiconductor device. The desired transistor also may be referred to herein as a model transistor, a transistor structure, or a desired transistor structure. As illustrative, non-exclusive examples, the defining at 210 can include selecting a doping level for a plurality of channels of the array of trenched-gate power transistors, selecting a doping level for a plurality of source regions of the array of trenched-gate power transistors, selecting a doping level for a plurality of drain drift regions of the array of trenched-gate power transistors, selecting a doping level for a plurality of body regions of the array of trenched-gate power transistors, selecting a gate oxide thickness for the array of trenched-gate power transistors, selecting a target (or desired) breakdown voltage for the array of trenched-gate power transistors, selecting a trench depth for the plurality of inner trenches and for the plurality of outer trenches, or selecting a trench width for the plurality of inner trenches and for the plurality of outer trenches. Illustrative, non-exclusive examples of a structure of the desired transistor are disclosed herein.

Modeling the breakdown voltage of the desired transistor at 220 includes modeling the breakdown voltage as a function of spacing between a trench of the desired transistor and an adjacent trench of an adjacent transistor. The modeling at 220 can include determining, or estimating, the breakdown voltage at a plurality of discrete spacing values or determining, or estimating, a functional relationship between the breakdown voltage and the spacing. The adjacent transistor can be at least substantially similar to the desired transistor.

Selecting the average inner region spacing at 230 includes selecting the average inner region spacing based, at least in part, on the modelling at 220. Similarly, selecting the average termination region spacing at 240 includes selecting the average termination region spacing based, at least in part, on the modelling at 220. The selecting at 230 and the selecting at 240 include selecting such that a breakdown voltage in the termination region is greater than a breakdown voltage in the inner region. As an illustrative, non-exclusive example, and as discussed, the average termination region spacing is selected to be greater than the average inner region spacing. Additionally or alternatively, the average termination region spacing can be selected to be at, or near, a spacing at a maximum value of a breakdown voltage vs. trench spacing curve, while the average inner region spacing can be selected to be less than the spacing at the maximum value of the breakdown voltage vs. trench spacing curve. This spacing permits the transistors within the termination region to function as termination structures for the trenched-gate semiconductor device and permits trenched-gate semiconductor devices according to the present disclosure to avoid transistor breakdown within the termination region without the need for more traditional termination structures. Illustrative, non-exclusive examples of the average inner region spacing and the average termination region spacing are disclosed herein.

Although the invention is described herein with reference to specific embodiments, various modifications and changes can be made without departing from the scope of the present invention as set forth in the claims below. For example, a variety of relative average inner region spacing and average termination region spacing values can be utilized to provide a higher breakdown voltage in the termination region relative to the inner region. As another example, the array of trenched-gate power transistors can, but is not required to, include an intermediate region that includes a plurality of intermediate transistors. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first" and "second" are used to arbitrarily distinguish between the elements such terms describe. Thus, these terms are not necessarily intended to indicate temporal or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function may additionally or alternatively be described as being configured to perform that function, and vice versa.

As used herein, the term "or" should be interpreted as being inclusive or exclusive. For example, "A or B" can be interpreted to mean A, B, or both A and B.

The following are various embodiments of the present invention.

In a first embodiment, there is provided a trenched-gate semiconductor device. The trenched-gate semiconductor device includes a semiconducting material and an array of trenched-gate power transistors. The array defines an inner region, which includes a plurality of inner transistors. The array also defines a termination region, which includes a plurality of outer transistors. Each transistor in the array includes an electrically conductive gate, which extends within a trench that is defined within the semiconducting material, and a gate oxide, which electrically separates the electrically conductive gate from the semiconducting material. The plurality of inner transistors includes a plurality of inner trenches. The plurality of inner trenches has, or defines, an average inner region spacing. The average inner region spacing is defined between each of the plurality of inner trenches and a closest other of the plurality of inner trenches. The plurality of outer transistors includes a plurality of outer trenches. The plurality of outer trenches has, or defines, an average termination region spacing. The average termination region spacing is defined between each of the outer trenches and a closest one of the plurality of inner trenches. The average termination region spacing is at least 105% and less than 120% of the average inner region spacing. Additional illustrative, non-exclusive examples of relative proportions of the average termination region spacing and the average inner region spacing are disclosed herein. The semiconducting material can define a plurality of columns. The plurality of columns can extend between adjacent trenches in the array. Each column can include a source region of a first conductivity type. Each column can include a drain drift region of the first conductivity type. Each column can include a body region of a second conductivity type. The body region can extend between the source region and the drain drift region. The body region can extend in contact with the gate oxide. The body region can define a channel region. Each column can include a RESURF region. The RESURF region can be configured to form a depletion region within the drain drift region. The plurality of inner transistors may include a plurality of intermediate transistors. Each of the plurality of intermediate transistors can extend between a respective one of the plurality of outer transistors and a respective other of the plurality of inner transistors. The plurality of intermediate transistors can include a plurality of intermediate trenches. The plurality of intermediate trenches can have, or define, an average intermediate region spacing. The average intermediate region spacing can be defined between each of the plurality of intermediate trenches and a closest other of the plurality of inner trenches. The average termination region spacing can be defined between the plurality of intermediate trenches and the plurality of outer trenches. The average termination region spacing can be at least 110% and less than 120% of the average inner region spacing. The average intermediate region spacing can be at least 105% and less than 110% of the average inner region spacing. Additional illustrative, non-exclusive examples of relative proportions of the average intermediate region spacing are disclosed herein. An average inner trench width of the plurality of inner trenches can be nominally equal to an average outer trench width of the plurality of outer trenches. An average inner trench depth of the plurality of inner trenches can be nominally equal to an average outer trench depth of the plurality of outer trenches. A spacing between each of the plurality of inner trenches and the closest other of the plurality of inner trenches can be nominally constant. The array can be a two-dimensional array. The plurality of inner transistors can be surrounded by the plurality of outer transistors. Each of the plurality of inner trenches can include an electrically conductive field plate. A respective electrically conductive field plate can be located below a respective electrically conductive gate within a respective inner trench of the plurality of inner trenches. The electrically conductive field plate can be electrically connected to a ground plane of the device. The electrically conductive field plate can be electrically separated from the semiconducting material by a thick isolating oxide. The electrically conductive field plate can be electrically separated from the electrically conductive gate by a thin isolating oxide.

In a second embodiment, there is provided a method of forming a trenched-gate semiconductor device. The trenched-gate semiconductor device can include, or be, the trenched-gate semiconductor device of the first embodiment. The method includes forming a plurality of inner trenches within a semiconducting material. The forming the plurality of inner trenches includes forming an inner region of an array of trenched-gate power transistors. The plurality of inner trenches has, or defines, an average inner region spacing. The average inner region spacing is defined between each of the plurality of inner trenches and a closest other of the plurality of inner trenches. The method includes forming a plurality of outer trenches. The forming the plurality of outer trenches includes forming a termination region of the array of trenched-gate power transistors. The plurality of outer trenches has, or defines, an average termination region spacing. The average termination region spacing is defined between each of the plurality of outer trenches and a closest one of the plurality of inner trenches. The average termination region spacing is at least 105% and less than 120% of the average inner region spacing. Additional illustrative, non-exclusive examples of relative proportions of the average termination region spacing and the average inner region spacing are disclosed herein. The method can include forming a gate oxide within each of the plurality of inner trenches. The method can include forming a gate oxide within each of the plurality of outer trenches. The method can include forming an electrically conductive gate within each of the plurality of inner trenches. The method can include forming an electrically conductive gate within each of the plurality of outer trenches. The gate oxide can electrically separate the electrically conductive gates from the semiconducting material. The forming the plurality of inner trenches and the forming the plurality of outer trenches can include forming a plurality of columns of the semiconducting material. The plurality of columns can extend between adjacent trenches in the array. Each column of the plurality of columns can include a respective source region of a first conductivity type. Each column of the plurality of columns can include a respective drain drift region of the first conductivity type. The method further can include forming a respective body region in each column of the plurality of columns. The respective body region can be of a second conductivity type. The respective body region can extend between the respective source region and the respective drain drift region. The respective body region can extend in contact with the gate oxide. The respective body region can define a channel region. The method further can include forming an electrically conductive field plate within each of the plurality of inner trenches. The forming the electrically conductive field plate can be performed subsequent to the forming the gate oxide within each of the plurality of inner trenches or within each of the plurality of outer trenches or prior to the forming the electrically conductive gate within each of the plurality of inner trenches or within each of the plurality of outer trenches. The method can include forming a thin isolating oxide on the electrically conductive field plate. The thin isolating oxide can extend between the electrically conductive field plate and the electrically conductive gate. The plurality of inner trenches may include a plurality of intermediate trenches. Each of the plurality of intermediate trenches can extend between a respective one of the plurality of outer trenches and a respective one of a remainder of the plurality of inner trenches. The plurality of intermediate trenches can have an average intermediate region spacing. The average intermediate region spacing can be defined between each of the plurality of intermediate trenches and the respective one of the remainder of the plurality of inner trenches. The average termination region spacing can be defined between the plurality of intermediate trenches and the plurality of outer trenches. The method can include forming the plurality of inner trenches, the plurality of intermediate trenches, and the plurality of outer trenches such that the average intermediate region spacing is greater than the average inner region spacing but less than the average termination region spacing. The average intermediate region spacing can be at least 105% and less than 110% of the average inner region spacing. The average termination region spacing can be at least 110% and less than 120% of the average inner region spacing. The method can include forming the plurality of inner trenches or forming the plurality of outer trenches such that an average trench width of the plurality of inner trenches is nominally equal to an average trench width of the plurality of outer trenches. The method can include forming the plurality of inner trenches or forming the plurality of outer trenches such that an average inner trench depth of the plurality of inner trenches is nominally equal to an average outer trench depth of the plurality of outer trenches. The method can include forming the plurality of inner trenches such that a spacing between each of the plurality of inner trenches and the closest other of the plurality of inner trenches is nominally constant.

In a third embodiment, there is provided a method of designing a trenched-gate semiconductor device. The device includes an array of trenched-gate power transistors. Each trenched-gate power transistor in the array includes an electrically conductive gate that extends within a trench. The trench is defined within a semiconducting material. Each trenched-gate power transistor in the array also includes a gate oxide that electrically separates the electrically conductive gate from the semiconducting material. The array defines an inner region. The inner region includes a plurality of inner transistors. The plurality of inner transistors includes a plurality of inner trenches. The plurality of inner trenches has, or defines, an average inner region spacing. The average inner region spacing is defined between each of the plurality of inner trenches and a closest other of the plurality of inner trenches. The array defines a termination region. The termination region includes a plurality of outer transistors. The plurality of outer transistors includes a plurality of outer trenches. The plurality of outer trenches has, or defines, an average termination region spacing. The average termination region spacing is defined between each of the plurality of outer trenches and a closest one of the plurality of inner trenches. The method includes defining a desired transistor of the trenched-gate semiconductor device. The method includes modeling a breakdown voltage of the desired transistor as a function of a spacing between a trench of the desired transistor and an adjacent trench of an adjacent transistor. The method includes selecting the average inner region spacing based on the modeling. The method includes selecting the average termination region spacing based on the modeling. The method includes selecting the average inner region spacing or selecting the average termination region spacing such that a breakdown voltage in the termination region is greater than a breakdown voltage in the inner region. The method can include selecting the average termination region spacing to be at least 105% and less than 120% of the average inner region spacing. Additional illustrative, non-exclusive examples of relative proportions of the average termination region spacing and the average inner region spacing are disclosed herein. The adjacent transistor can be structurally similar (or even identical) to the desired transistor. The defining the desired transistor can include selecting a doping level for a plurality of channels of the array of trenched-gate power transistors. The defining the desired transistor can include selecting a gate oxide thickness for the array of trenched-gate power transistors. The defining the desired transistor can include selecting a target breakdown voltage for the array of trenched-gate power transistors. The defining the desired transistor can include selecting a trench depth for the trench.

What is claimed is:

1. A trenched-gate semiconductor device, comprising:
   a semiconducting material; and
   an array of trenched-gate power transistors that defines an inner region including a plurality of inner transistors and a termination region including a plurality of outer transistors, wherein:
   the plurality of inner transistors comprises a plurality of inner trenches that has an average inner region spacing as defined between each of the plurality of inner trenches and a closest other of the plurality of inner trenches;
   the plurality of outer transistors comprises a plurality of outer trenches that has an average termination region spacing as defined between each of the plurality of outer trenches and a closest one of the plurality of inner trenches;
   the average termination region spacing is at least 105% and less than 120% of the average inner region spacing; and
   each transistor in the array of trenched-gate power transistors comprises an electrically conductive gate that extends within a trench, which is defined within the semiconducting material, and a gate oxide, which electrically separates the electrically conductive gate from the semiconducting material.

2. The device of claim 1, wherein the semiconducting material defines a plurality of columns that extends between adjacent trenches in the array of trenched-gate power transistors.

3. The device of claim 2, wherein each column of the plurality of columns comprises a source region of a first conductivity type, a drain drift region of the first conductivity type, and a body region of a second conductivity type, wherein the body region extends between the source region and the drain drift region and in contact with the gate oxide to define a channel region.

4. The device of claim 3, wherein each column further comprises a RESURF region that is configured to form a depletion region within the drain drift region.

5. The device of claim 1, wherein the plurality of inner transistors comprises:
   a plurality of intermediate transistors, wherein:
     each intermediate transistor extends between a respective one of the plurality of outer transistors and a respective other of the plurality of inner transistors;
     the plurality of intermediate transistors comprises a plurality of intermediate trenches having an average intermediate region spacing defined between each of the plurality of intermediate trenches and a nearest other of the plurality of inner trenches;
     the average termination region spacing is defined between the plurality of intermediate trenches and the plurality of outer trenches and is greater than 110% and less than 120% of the average inner region spacing; and
     the average intermediate region spacing is at least 105% and less than 110% of the average inner region spacing.

6. The device of claim 1, wherein at least one of:
   (i) an average inner trench width of the plurality of inner trenches is nominally equal to an average outer trench width of the plurality of outer trenches;
   (ii) an average inner trench depth of the plurality of inner trenches is nominally equal to an average outer trench depth of the plurality of outer trenches; and (iii) a spacing between each of the plurality of inner trenches and the closest other of the plurality of inner trenches is nominally constant.

7. The device of claim 1, wherein the array of trenched-gate power transistors is a two-dimensional array of trenched-gate power transistors in which the plurality of inner transistors is surrounded by the plurality of outer transistors.

8. The device of claim 1, wherein each of the plurality of inner trenches further comprises:
an electrically conductive field plate that is located below a respective electrically conductive gate within a respective inner trench of the plurality of inner trenches, wherein:
the electrically conductive field plate is electrically connected to a ground plane of the device, and
the electrically conductive field plate is electrically separated from the semiconducting material by a thick isolating oxide and from the respective electrically conductive gate by a thin isolating oxide.

9. A method of forming a trenched-gate semiconductor device, the method comprising:
forming a plurality of inner trenches within a semiconducting material to define an inner region of an array of trenched-gate power transistors, wherein the plurality of inner trenches has an average inner region spacing as defined between each of the plurality of inner trenches and a closest other of the plurality of inner trenches; and
forming a plurality of outer trenches within the semiconducting material to define a termination region of the array of trenched-gate power transistors, wherein the plurality of outer trenches has an average termination region spacing as defined between each of the plurality of outer trenches and a closest one of the plurality of inner trenches, and further wherein the average termination region spacing is at least 105% and less than 120% of the average inner region spacing.

10. The method of claim 9, wherein the method further comprises:
forming a gate oxide within each of the plurality of inner trenches and within each of the plurality of outer trenches; and
forming an electrically conductive gate within each of the plurality of inner trenches and within each of the plurality of outer trenches, wherein the gate oxide electrically separates the electrically conductive gate from the semiconducting material.

11. The method of claim 10, wherein the forming the plurality of inner trenches and the forming the plurality of outer trenches comprises forming a plurality of columns of the semiconducting material, wherein the plurality of columns extends between adjacent trenches in the array of trenched-gate power transistors.

12. The method of claim 11, wherein each column of the plurality of columns comprises a respective source region of a first conductivity type and a respective drain drift region of the first conductivity type, and wherein the method further comprises:
forming a respective body region of a second conductivity type in each column of the plurality of columns, wherein the respective body region extends between the respective source region and the respective drain drift region and in contact with the gate oxide to define a channel region.

13. The method of claim 10, wherein, subsequent to the forming the gate oxide and prior to the forming the electrically conductive gate, the method further comprises forming an electrically conductive field plate within each of the plurality of inner trenches and subsequently forming a thin isolating oxide on the electrically conductive field plate such that the thin isolating oxide extends between the electrically conductive field plate and the electrically conductive gate.

14. The method of claim 9, wherein the plurality of inner trenches comprises a plurality of intermediate trenches, wherein each of the plurality of intermediate trenches extends between a respective one of the plurality of outer trenches and a respective one of a remainder of the plurality of inner trenches, wherein the plurality of intermediate trenches has an average intermediate region spacing as defined between each of the plurality of intermediate trenches and the respective one of the remainder of the plurality of inner trenches, wherein the average termination region spacing is defined between the plurality of intermediate trenches and the plurality of outer trenches, and further wherein the method comprises:
forming the plurality of inner trenches, the plurality of intermediate trenches, and the plurality of outer trenches such that the average intermediate region spacing is greater than the average inner region spacing but less than the average termination region spacing.

15. The method of claim 14, wherein the method comprises forming the plurality of inner trenches, the plurality of intermediate trenches, and the plurality of outer trenches such that the average termination region spacing is at least 110% and less than 120% of the average inner region spacing and such that the average intermediate region spacing is at least 105% and less than 110% of the average inner region spacing.

16. The method of claim 9, wherein the forming the plurality of inner trenches and the forming the plurality of outer trenches are performed such that at least one of:
(i) an average inner trench width of the plurality of inner trenches is nominally equal to an average outer trench width of the plurality of outer trenches;
(ii) an average inner trench depth of the plurality of inner trenches is nominally equal to an average outer trench depth of the plurality of outer trenches; and
(iii) a spacing between each of the plurality of inner trenches and the closest other of the plurality of inner trenches is nominally constant.

17. A method of designing a trenched-gate semiconductor device that comprises an array of trenched-gate power transistors, the method comprising:
defining a desired transistor of the trenched-gate semiconductor device, wherein the desired transistor comprises an electrically conductive gate that extends within a trench, which is defined within a semiconducting material, and a gate oxide, which electrically separates the electrically conductive gate from the semiconducting material, and further wherein the array of trenched-gate power transistors defines an inner region including a plurality of inner transistors, which comprises a plurality of inner trenches that has an average inner region spacing as defined between each of the plurality of inner trenches and a closest other of the plurality of inner trenches, and a termination region including a plurality of outer transistors, which comprises a plurality of outer trenches that has an average termination region spacing as defined between each of the plurality of outer trenches and a closest one of the plurality of inner trenches;
modeling a breakdown voltage of the desired transistor as a function of a spacing between a trench of the desired transistor and an adjacent trench of an adjacent transistor; and
selecting the average inner region spacing and the average termination region spacing based, at least in part, on the modeling, wherein the selecting comprises selecting such that a breakdown voltage in the termination region is greater than a breakdown voltage in the inner region.

18. The method of claim 17, wherein the selecting comprises selecting such that the average termination region spacing is at least 105% and less than 120% of the average inner region spacing.

19. The method of claim 17, wherein the adjacent transistor is structurally similar to the desired transistor.

20. The method of claim 17, wherein the defining the desired transistor comprises at least one of:
(i) selecting a doping level for a plurality of channels of the array of trenched-gate power transistors;
(ii) selecting a gate oxide thickness for the array of trenched-gate power transistors;
(iii) selecting a target breakdown voltage for the array of trenched-gate power transistors; and
(iv) selecting a trench depth for the trench.

* * * * *